(12) United States Patent
Pouplier

(10) Patent No.: US 8,736,400 B2
(45) Date of Patent: May 27, 2014

(54) QUICK TRACTABLE FILTER

(75) Inventor: Marc Pouplier, Cosnac (FR)

(73) Assignee: Thales, Neuilly sur Seine (FR)

( * ) Notice: Subject to any disclaimer, the term of this patent is extended or adjusted under 35 U.S.C. 154(b) by 1142 days.

(21) Appl. No.: 12/444,468

(22) PCT Filed: Oct. 5, 2007

(86) PCT No.: PCT/EP2007/060595
§ 371 (c)(1),
(2), (4) Date: Mar. 18, 2010

(87) PCT Pub. No.: WO2008/040801
PCT Pub. Date: Apr. 10, 2008

(65) Prior Publication Data
US 2010/0188172 A1 Jul. 29, 2010

(30) Foreign Application Priority Data
Oct. 6, 2006 (FR) ...................................... 06 08796

(51) Int. Cl.
*H03H 7/01* (2006.01)
*H03H 7/12* (2006.01)

(52) U.S. Cl.
USPC ............................ 333/167; 333/174; 333/175

(58) Field of Classification Search
USPC .......... 333/167, 174, 175; 334/15, 58, 78, 79, 334/83
See application file for complete search history.

(56) References Cited

U.S. PATENT DOCUMENTS

| | | | | |
|---|---|---|---|---|
| 5,028,894 A * | 7/1991 | Speake | ......................... | 333/174 |
| 5,107,233 A * | 4/1992 | Stoft | ............................ | 333/168 |
| 5,285,179 A * | 2/1994 | Wignot et al. | .................. | 334/15 |
| 5,376,907 A * | 12/1994 | Duflot et al. | .................. | 333/174 |
| 5,752,179 A | 5/1998 | Dobrovolny | | |
| 6,965,275 B2 * | 11/2005 | Di Giandomenico et al. | ........................... | 333/17.1 |
| 7,385,465 B2 * | 6/2008 | Chen | ............................ | 333/175 |
| 7,773,707 B2 * | 8/2010 | Einbinder | ..................... | 375/350 |
| 2002/0180560 A1 * | 12/2002 | Hernandez | ..................... | 333/174 |

FOREIGN PATENT DOCUMENTS

| | | |
|---|---|---|
| GB | 2313008 A | 11/1997 |
| JP | 2006237794 A | 9/2006 |

* cited by examiner

*Primary Examiner* — Dean O Takaoka
*Assistant Examiner* — Alan Wong
(74) *Attorney, Agent, or Firm* — Stroock & Stroock & Lavan LLP

(57) ABSTRACT

A bandpass filter includes a first oscillating circuit having inductors ($L_1$, $L_2$) in parallel with capacitors ($C_{ij1}$), and a second oscillating circuit having inductors ($L_3$, $L_4$) arranged in parallel with capacitors ($C_{ij2}$). The capacitors ($C_{ij1}$) of the first oscillating circuit have an assembly of variable capacitive elements ($C_{11}$, $C_{12}$, $C_{13}$, $C_{14}$) in series with a fixed capacitor ($C_1$), and the capacitors ($C_{ij}2$) of the second oscillating circuit have an assembly of variable capacitive elements ($C_{21}$, $C_{22}$, $C_{23}$, $C_{24}$) arranged in series with a fixed capacitor ($C_2$). The first oscillating circuit and the second oscillating circuit are coupled together with capacitors of substantially fixed value ($C_3$, $C_4$) and these coupling capacitors are linked to different respective midpoints between variable capacitors in the first and second oscillating circuits.

6 Claims, 4 Drawing Sheets

QUICK TRACTABLE FILTER

CROSS-REFERENCE TO PRIOR APPLICATION

Figure 1:
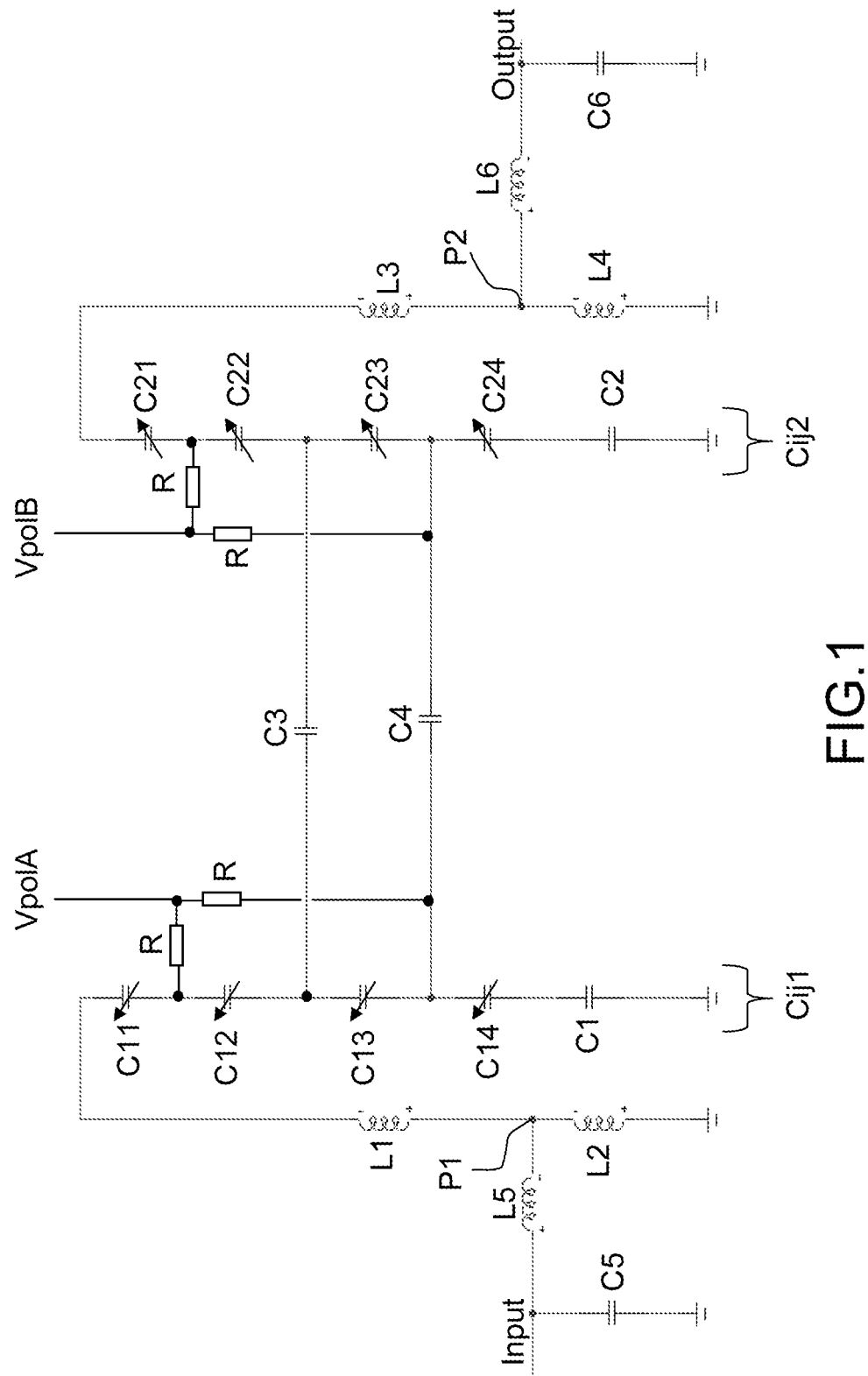

This is a U.S. National Phase Application under 35 U.S.C. §371 of International Application no. PCT/EP2007/060595, filed Oct. 5, 2007, and claims benefit of French Patent Application No. 06 08796, filed Oct. 6, 2006, both of which are incorporated herein. The International Application was published in French on Apr. 10, 2008 as WO 2008/040801 under PCT Article 21 (2).

The patent relates to a filter of the family of bandpass filters embodied using coupled oscillating circuits (inductor capacitor).

The invention relates to a very linear, fast tractable HF filter with constant passband whose shape factor is optimal throughout its frequency range and at any temperature taken together, by virtue of separate control voltages.

It is used, for example, in all highly linear filters which require constant-passband coupling, that is to say that the passband of the filter must remain fixed as a function of the tuning frequency.

It is used for example in radiocommunication equipment, in particular in respect of the HF front-end filters of frequency-hopping agile receivers subjected to heavily jammed environments.

In the field of reception, receivers are confronted with environments that are increasingly polluted by undesirable spurious transmissions. So that these jammers are not troublesome, it is desirable to eliminate them or to reduce their influence by filtering, but on condition that the filters do not cause any distortion of the useful signal through lack of linearity.

The environmental requirement makes it necessary to reduce the influence of these jammers when they are distant by a constant with respect to the useful signal (and not as a percentage), hence the necessity to use filters with fixed rather than frequency-varying passband. These constant-passband filters, which are difficult to make, require couplings with elements that are variable (varicap type for example), but incompatible with the necessary linearity.

The characteristics usually used to quantify linearity are: the 1 dB compression point ($I_{pc}$) and the $3^{rd}$-order intercept point ($IP_3$).

A non-linear function creates additional spectral lines through mixing, transmodulation phenomena and saturations of the useful signal. The filtering function must therefore have a large $IP_3$ and a high 1 dB compression point so as to limit these major drawbacks in a receiver. The requirement in terms of 1 dB compression point and $IP_3$ cannot be achieved with the prior art.

The components used in filters have tolerances. To alleviate this drawback, if one wishes to preserve the best shape factor, it is necessary to have additional adjustment settings. The prior art devices using only a single control for the whole filter, do not make it possible to have a setting suited to all tuning frequencies. Calculations show that there can only be a compromise.

These components also vary as a function of temperature and require temperature compensation which always turns out to be tricky and non-reproducible by the prior art.

To vary with frequency and retain a constant passband, it is known from the prior art to use variable elements in the oscillating circuits and in the coupling, in general varicaps (variable-capacitance diode), this giving rise to an appreciable deterioration in the linearity.

For the required shape factors, it is necessary that the controls of the varicaps are effected through a high impedance so as not to damp the oscillating circuits. Unfortunately, to guarantee this necessary tuning time, the prior art can only penalize the shape factor so as to be compatible with the latter.

To summarize: the prior art devices exhibit the following drawbacks:

The simple use of varicaps in the oscillating circuits and in the coupling does not make it possible to obtain high linearity, The settings are never optimal over the entire frequency-tuning range, The disparity of the components requires complementary adjustment elements, The shape factor of the filter varies as a function of frequency and temperature, The shape factor and the speed are two factors in opposition (damping of the oscillating circuits by the varicap biasing resistors).

The idea of the present invention proposes a filter architecture where the variation with frequency is effected using several varicaps in each oscillating circuit, the varicaps being mounted in series with a fixed capacitor. This makes it possible to reduce the voltage developed across the terminals of each of these varicaps, while making it possible to have intermediate wiring points for coupling with fixed elements. This principle makes it possible to obtain very high linearities.

The invention relates to a bandpass filter comprising at least one first oscillating circuit formed of inductive means ($L_1$, $L_2$) in parallel with capacitive means ($C_{ij1}$) and of a second oscillating circuit comprising inductive means ($L_3$, $L_4$) arranged in parallel with capacitive elements ($C_{ij2}$), the first oscillating circuit being coupled to the second oscillating circuit, characterized in that the capacitive means ($C_{ij1}$) of the first oscillating circuit comprises an assembly of variable capacitive elements ($C_{11}$, $C_{12}$, $C_{13}$, $C_{14}$) in series with a fixed capacitor ($C_1$) and in that the capacitive elements of the second oscillating circuit comprises an assembly of variable capacitive elements ($C_{21}$, $C_{22}$, $C_{23}$, $C_{24}$) arranged in series with a fixed capacitor ($C_2$) and in that the first oscillating circuit and the second oscillating circuit are coupled by means of capacitive elements of substantially fixed value ($C_3$, $C_4$) and in that the capacitive coupling elements are linked between variable capacitive elements in the first capacitive means ($C_{ij1}$) and the second capacitive means ($C_{ij2}$).

A variable capacitive element ($C_{11}'$) mounted in series with the fixed capacitor comprises for example several variable capacitors mounted in parallel ($C_{111}'$ $C_{112}'$).

Figure 2:
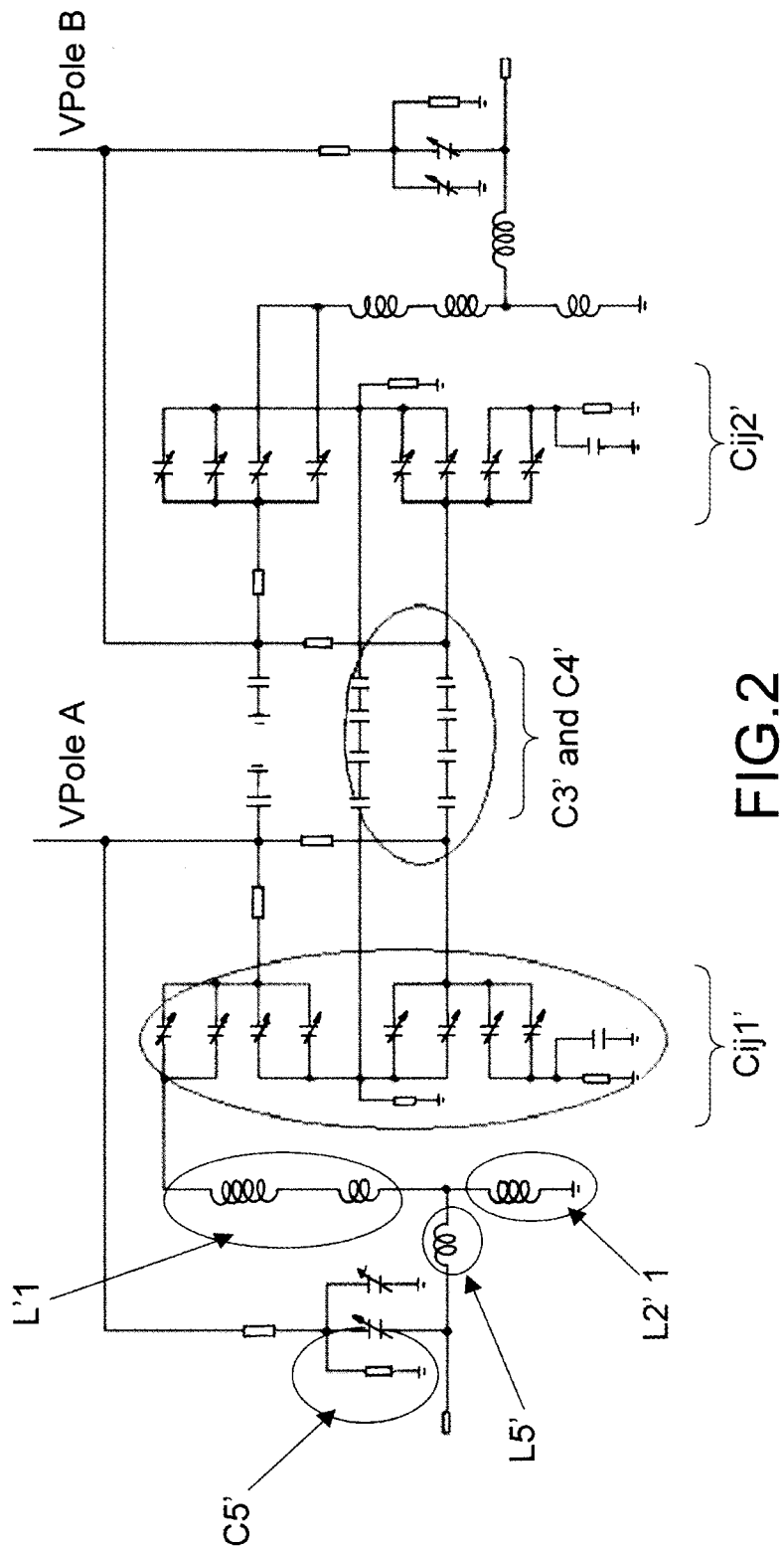
Figure 3:
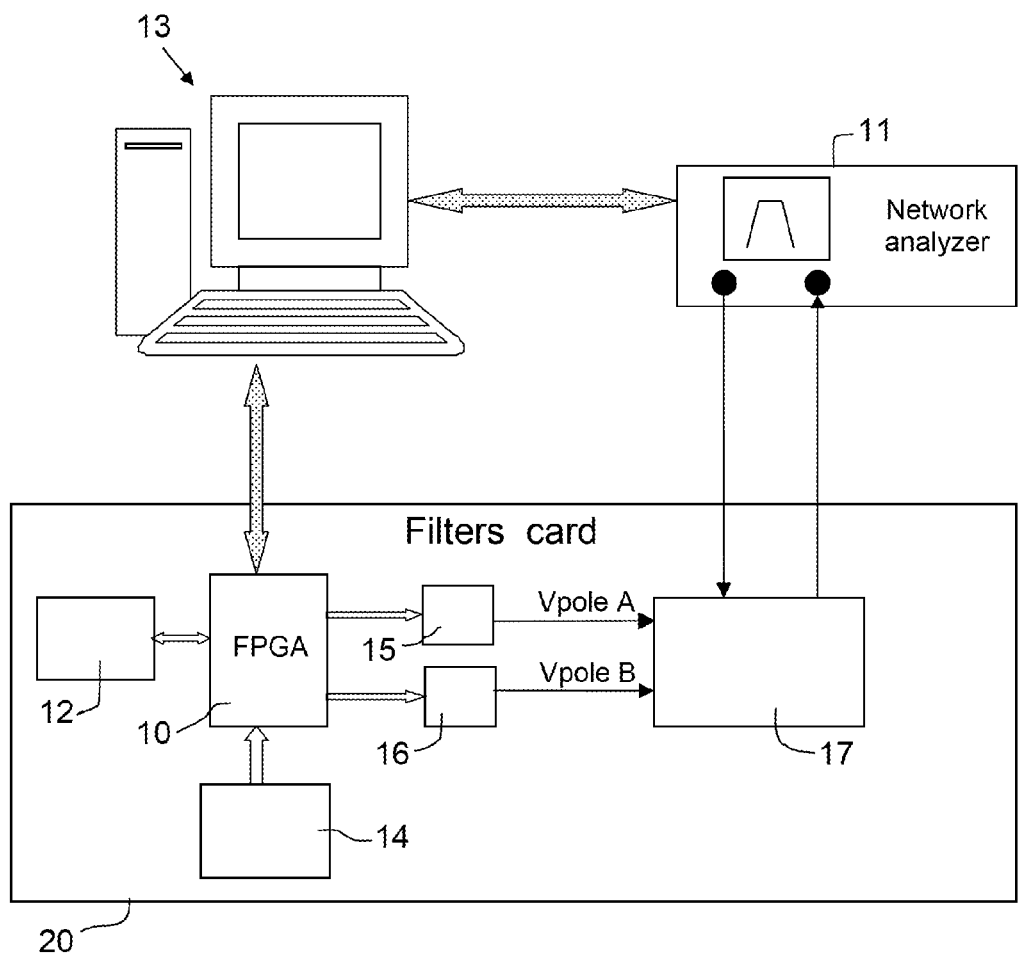
Figure 4:
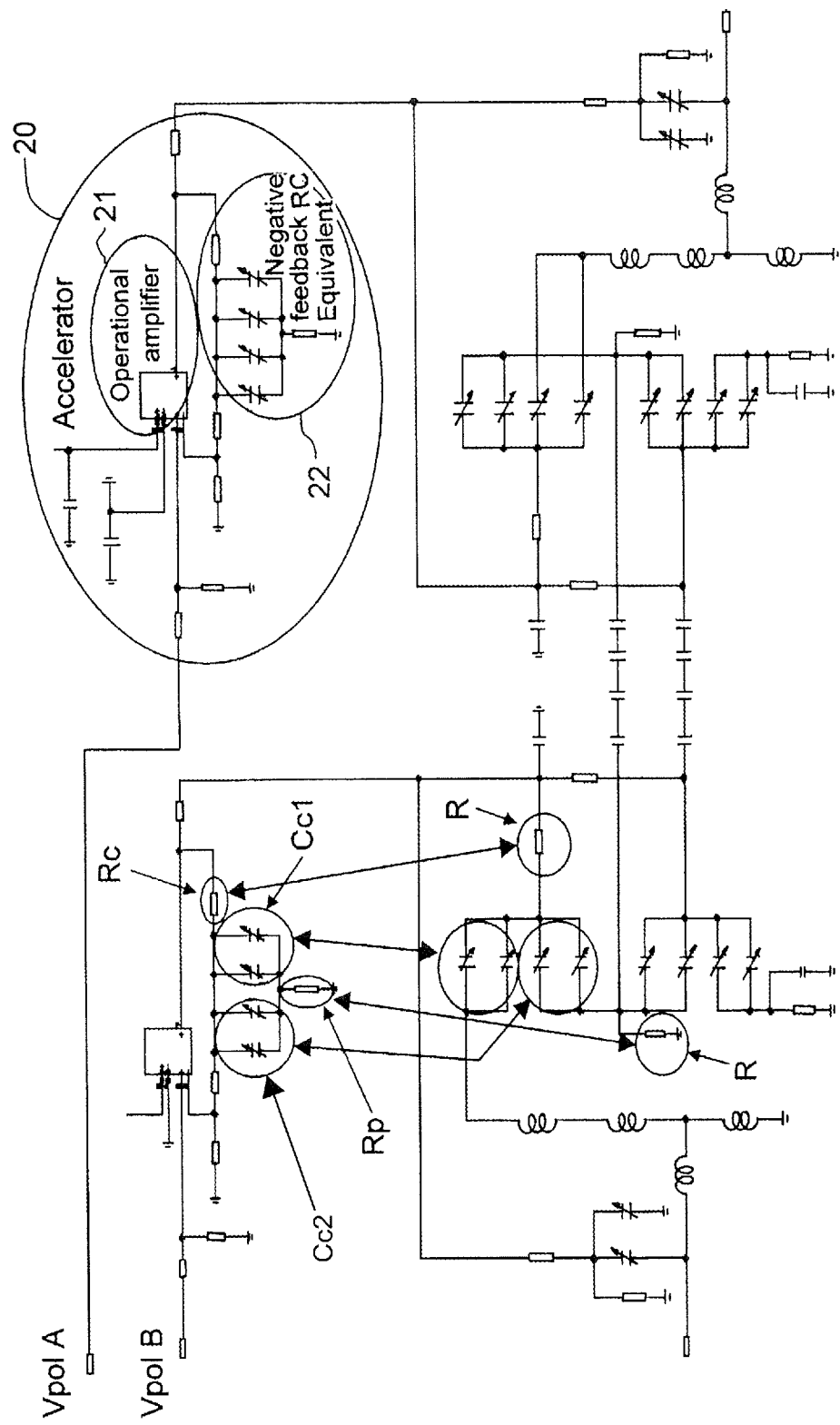

Other characteristics and advantages of the present invention will be more apparent on reading the description which follows of an exemplary embodiment given by way of wholly nonlimiting illustration in conjunction with the appended figures which represent:

FIG. 1 a diagram illustrating the basic architecture of a filter according to the invention, FIG. 2 an example of a filter according to the invention and of a specific coupling, FIG. 3 the diagram of an application making it possible to control the filter temperature-wise, FIG. 4 a basic diagram of a variant embodiment making it possible to reduce the filter tuning time.

In order to better elucidate the object of the present invention, the description which follows is given by way of non-limiting illustration for a filter used as a tuning filter.

In the basic FIG. 1, the filter 1 comprises:

A first part I (input oscillating circuit) composed of two inductors $L_1$, $L_2$ with in parallel a capacitive assembly itself comprising a group of variable capacitors $C_{ij}$ ($C_{11}$, $C_{12}$, $C_{13}$, $C_{14}$) in series with a fixed capacitor $C_1$. In order to drive the variable elements, this first part receives a supply voltage denoted VpoleA.

A second part II (output oscillating circuit) composed of two inductors $L_3$, $L_4$ with in parallel a capacitive assembly $C_{ij}$ consisting of a group of variable capacitors $C_{21}$, $C_{22}$, $C_{23}$, $C_{24}$ arranged in series with a fixed capacitor $C_2$. In order to drive the variable elements, this second part receives a supply voltage denoted VpoleB.

The first part I of the filter and the second part II of the filter are coupled in this exemplary embodiment by a capacitive assembly of fixed elements $C_3$ and $C_4$.

The inductor $L_5$ and the capacitor $C_5$ connected to the intermediate point $L_1$ and $L_2$ (referenced P1) allows impedance transfer so as to have 50 Ohms at input (In), The inductor $L_6$ and the capacitor $C_6$ connected to the intermediate point $L_3$ and $L_4$ (referenced $P_2$) allows impedance transfer so as to have 50 Ohms at output (Out), Several varicap biasing resistors, R, certain of which are represented for simplification reasons. The values of these resistors are very high, and greater in general than several hundred K ohms. Their positioning in the circuit is known to the Person skilled in the art.

In this FIG. 1, the representation of $C_{11}$, $C_{12}$, $C_{13}$, $C_{14}$ of the first oscillating circuit and of $C_{21}$, $C_{22}$, $C_{23}$, $C_{24}$ of the second oscillating circuit mounted in series indicates in reality a varicap in each instance.

The passband, tuning frequency ratio ($\Delta F/F$) determines the necessary overvoltage coefficient of the filter (Q) as a function of the requirement. Each oscillating circuit works at high impedance (a few Kohms). The wiring scheme of $L_1$, $L_2$, $L_5$ and $C_5$ allows the transformation of working impedance of the oscillating circuits to 50 Ohms. The same holds for the output with $L_3$, $L_4$, $L_6$ and $C_6$.

On the basis of the chosen architecture of the filter, it is possible, for example by means of a simulation, and by optimization, to determine the values of the various elements constituting the filter as a function of the application or of the objective desired by the operator.

With such an architecture, the equivalent value of the first coupling capacitor series is predominant in fixing the low-frequency passband of the filter and the other series for the high frequencies. The compromise between the values of the capacitors and the points linking the varicaps makes it possible to fix the shape factor of the filter.

The varicaps are chosen, for example, by taking those which offer the best linearity.

The tuning frequency of a filter being the resonant frequency of the oscillating circuits ($LC\omega^2=1$); L being the value of inductors and C the equivalent capacitance of the varicaps and of the fixed capacitor placed in parallel, and $\omega$ the resonant frequency of the oscillating circuit; for certain sub-range of tractable filters, so as to satisfy the condition $LC\omega^2=1$, the filter comprises varicaps in parallel so as to obtain a larger equivalent capacitance. An example is given in FIG. 2. This makes it possible notably to satisfy the bulkiness, quality factor compromise.

FIG. 2 represents a realization in which the varicaps are mounted according to a series layout with the fixed capacitor so as to satisfy the linearity and parallel so as have the capacitance value connected with the inductance value ($L_1+L_2$ or $L_3+L_4$) of the oscillating circuits of this filter.

The aim is still to limit the HF voltage across the terminals of the varicap and to have a coupling with fixed elements so as to obtain high linearity.

The elements constituting the filter $L_1'$, $C_5'$, $L_5'$, $L_2'$, $C_3'$, $C_4'$ are equivalent to the elements of FIG. 2 denoted $L_1$, $C_5$, $L_5$, $L_2$, $C_3$ and $C_4$ respectively.

The capacitive assembly $C_{ij1}'$ is formed like the assembly $C_{ij1}$ of FIG. 2, of a fixed capacitor C1' and of a group of varicaps $C_{11}'$, $C_{12}'$, $C_{13}'$, $C_{14}'$. Each varicap $C_{11}'$ comprises two varicaps in parallel $C_{111}'$, $C_{112}'$.

The second part of the filter II is constituted according to an identical layout, the varicaps of FIG. 2 being replaced with two varicaps in parallel.

Without departing from the scope of the invention, the number of varicaps in parallel is not limited.

FIG. 3 represents an example of the control of tractable filters such as represented in FIG. 1 and installed on a card 20 according to FIG. 2.

In order to better control the frequency-tuning of this filter, the voltages VpoleA and VpoleB are driven independently, as a function of temperature and frequency.

The voltages VpoleA and VpoleB originate from a digital device 10 of FPGA type in which, by training with the aid of a network analyzer 11, the voltages VpoleA and VpoleB are digitized, then stored in a memory 12 for each tuning frequency of the filter, but also at all temperatures. A microcomputer 13 makes it possible to drive the device as a whole. The card comprising the filter also comprises a temperature sensor 14, providing the value of the temperature at each instant, two digital analog converters 15, 16 making it possible to deliver the value of the voltage making it possible to supply the two poles of the tractable filter 17.

The implementation is carried out in the manner explained hereinafter.

The network analyzer 11 makes it possible to control the shape factor of the filter. For a given frequency (via the microcomputer) and at a given temperature (internal to the module), VpoleA and VpoleB are altered independently until the right shape factor is obtained on the network analyzer. As soon as the desired shape factor is obtained, the corresponding values VpoleA and VpoleB are then stored for example in the form of a database in the memory 12. This operation is repeated for all the frequencies and all the temperatures. The filter, the network analyzer and the climatic enclosure, which is not represented in the figure, are driven in a synchronous manner by a program.

The conversion from digital into DC voltage by way of digital analog converter makes it possible to retrieve the voltages VpolA and VpolB for each tuning frequency of the filter at a given temperature.

According to this embodiment, each oscillating circuit receives its own control of the variable elements. During use, as a function of the desired frequency and of the temperature of the equipment, the FPGA device recovers the values VpoleA and VpoleB to be applied to the filter, via the digital analog converters. The filter being at a certain temperature, will then automatically clamp onto the right frequency requested by the operator and with the best possible shape factor (the one it had acquired during training).

This principle makes it possible notably to avoid:
Any manual setting,
Adding adjustment elements,
Always having the best possible shape factor in terms of frequency and temperature.

FIG. 4 describes an exemplary filter as well as the analog control circuits VpoleA and VpoleB In order not to damp the oscillating circuits, the control voltages of the variable capacitors are injected onto the varicaps with series resistors of large values. This leads to considering an RC integrator circuit (with C equal to the equivalent capacitance of the varicaps $C_{11}+C_{12}$ or $C_{13}+C_{14}$ for the first oscillating circuit and $C_{21}+C_{22}$ or $C_{23}+C_{24}$ for the second oscillating circuit). The value of C therefore varies as a function of the desired tuning frequency. When the value of the frequency varies, C also varies. The integrator circuit is therefore variable as a function of frequency.

According to a variant embodiment and so as to reduce the filter tuning time, a self-compensated accelerator is used. The principle consists in inserting into the negative feedback of the operational amplifier an integrator circuit equivalent to the RC of the filter; that is to say it comprises the same resistors and the same varicaps of the filter in its negative feedback.

An accelerator 20 comprises an operational amplifier 21 and a negative feedback circuit 22. The negative feedback circuit 22 comprises a resistor Rc whose value is identical to the value of the bias resistor R (FIG. 1) and a resistor Rp having a value identical to the value of the resistor R. It also comprises a first capacitive assembly $C_{c1}$ having a value identical to that of $C_{11}$ and a second capacitive assembly $C_{c2}$ whose value is identical to that of the value of $C_{12}$. These capacitive assemblies can consist of a single capacitor, or else as represented in FIG. 4, of two values of capacitors in parallel.

Such an accelerator exhibits the advantage of being self-adapted since the RC integrator varies in the same manner as the integration on the voltages applied to the varicaps via the series resistors.

The operational amplifier momentarily creates an overvoltage proportional to the integration in negative feedback. This overvoltage makes it possible to obtain the desired equilibrium as rapidly as possible.

The limits are:
The inherent rise times of the operational amplifier (V/µs),
The latter's supply voltages.
The invention described above can be applied in respect of filters with n poles.

The invention claimed is:

1. A bandpass filter comprising at least one first oscillating circuit formed of a first inductive means in parallel with a first capacitive means and of a second oscillating circuit comprising a second inductive means arranged in parallel with a second capacitive means, the first oscillating circuit being coupled to the second oscillating circuit, characterized in that the first capacitive means of the first oscillating circuit comprises an assembly of a plurality of variable capacitive elements in series with a first fixed capacitor, a first midpoint between two of the variable capacitive elements of the first capacitive means, a second midpoint between two of the variable capacitive elements of the first capacitive means, the second midpoint being spaced from the first midpoint by at least one of the variable capacitive elements of the first capacitive means, and in that the second capacitive means of the second oscillating circuit comprises an assembly of a plurality of variable capacitive elements arranged in series with a second fixed capacitor, a third midpoint between two of the variable capacitive elements of the second capacitive means, a fourth midpoint between two of the variable capacitive elements of the second capacitive means, the fourth midpoint being spaced from the third midpoint by at least one of the variable capacitive elements of the second capacitive means, and in that the first oscillating circuit and the second oscillating circuit are coupled by means of capacitive coupling elements of substantially fixed value and in that at least one of the capacitive coupling elements is linked to the first midpoint and the third midpoint, and at least another of the capacitive coupling elements is linked to the second midpoint and the fourth midpoint.

2. The filter as claimed in claim 1, characterized in that a variable capacitive element in the first capacitive means mounted in series with the first fixed capacitor comprises a plurality of variable capacitors mounted in parallel.

3. The filter as claimed in claim 1, characterized in that the filter comprises two oscillating circuits.

4. A filtering device characterized in that it comprises a filter with a plurality of poles as claimed in one of claims 1 to 3 and in that it comprises independent controls for each pole.

5. The filter as claimed in claim 1 further comprising an input capacitor and an input inductor linked to each other, the input capacitor further linked to ground, and wherein the first inductive means comprises at least two inductors linked together in series and the input inductor is further linked to a midpoint between the at least two inductors.

6. The filter as claimed in claim 1 further comprising an output capacitor and an output inductor linked to each other, the output capacitor further linked to ground, and wherein the second inductive means comprises at least two inductors linked together in series and the output inductor is further linked to a midpoint between the at least two inductors.

* * * * *